US009276474B2

United States Patent
Meinecke et al.

(10) Patent No.: US 9,276,474 B2
(45) Date of Patent: Mar. 1, 2016

(54) POWER CONVERSION SYSTEM WITH CONTROLLED NEUTRAL

(71) Applicant: Edison DC Systems, Inc., Milwaukee, WI (US)

(72) Inventors: John W. Meinecke, Grafton, WI (US); Randolph H. McHugh, Sullivan, WI (US); Nicholas A. Lemberg, Sussex, WI (US)

(73) Assignee: Edison DC Systems, Inc., Milwaukee, WI (US)

( * ) Notice: Subject to any disclaimer, the term of this patent is extended or adjusted under 35 U.S.C. 154(b) by 0 days.

(21) Appl. No.: 14/632,274

(22) Filed: Feb. 26, 2015

(65) Prior Publication Data

US 2015/0244268 A1    Aug. 27, 2015

Related U.S. Application Data

(60) Provisional application No. 61/945,529, filed on Feb. 27, 2014.

(51) Int. Cl.
*H02M 3/158* (2006.01)
*G06F 1/26* (2006.01)
(Continued)

(52) U.S. Cl.
CPC ............... *H02M 3/158* (2013.01); *G06F 1/26* (2013.01); *H05K 7/1489* (2013.01); *H05K 7/1492* (2013.01); *H05K 7/183* (2013.01); *H05K 7/20736* (2013.01)

(58) Field of Classification Search
CPC ............. H02M 5/297; H02M 5/4585; H02M 2001/0077
USPC ................................................ 323/265, 267
See application file for complete search history.

(56) References Cited

U.S. PATENT DOCUMENTS 5,615,092 A    3/1997  Helfrich
5,654,591 A *  8/1997  Mabboux ................ H02J 9/06
                                                                 307/64
(Continued)

FOREIGN PATENT DOCUMENTS

JP       2009-118692 A     5/2009
KR    10-2005-0000689 A    1/2005

OTHER PUBLICATIONS

International Search Report and Written Opinion for International Application No. PCT/US2015/018770, date of mailing of the international search report Sep. 30, 2015, 10 pages.
(Continued)

*Primary Examiner* — Timothy J Dole
*Assistant Examiner* — Yusef Ahmed
(74) *Attorney, Agent, or Firm* — Reinhart Boerner Van Deuren s.c.

(57) ABSTRACT

Improved electrical power conversion system configured to transfer power between a DC voltage differential occurring between input DC terminals and lower DC voltage differential made up of the output differential voltages between a positive output DC terminal and a system neutral terminal and a negative output DC terminal and the system neutral terminal. The system actively controls the output differential voltages to account for variations in the electrical loading placed on the system. The system also actively controls the neutral voltage differential between the neutral terminal and Earth Ground. The output differential voltages are controlled to be maintained within an acceptable range for the types of electrical loads powered by the system (e.g. computers, servers, LED lighting) and to the extent the differentials vary, the system corrects the variances at frequencies which do not adversely affect system circuit protection or the electrical loading on the system. Similarly, control of the neutral voltage differential is performed to maintain the differential constant (preferably at about 0 volts) and corrects variances at frequencies which do not adversely affect system circuit protection or the electrical loading on the system.

23 Claims, 11 Drawing Sheets

(51) Int. Cl.
*H05K 7/14* (2006.01)
*H05K 7/18* (2006.01)
*H05K 7/20* (2006.01)

(56) References Cited

U.S. PATENT DOCUMENTS

| | | | | |
|---|---|---|---|---|
| 5,892,674 | A * | 4/1999 | Shimada | H02M 7/219 363/127 |
| 6,307,760 | B1 * | 10/2001 | Ikimi | H02M 5/4585 363/37 |
| 7,719,864 | B2 * | 5/2010 | Kernahan | H02M 3/155 323/222 |
| 2005/0029963 | A1 | 2/2005 | Lee | |
| 2010/0270977 | A1 * | 10/2010 | Samstad | H02J 7/0052 320/137 |
| 2010/0315849 | A1 * | 12/2010 | Ingemi | H02J 9/062 363/89 |
| 2011/0012435 | A1 * | 1/2011 | Cohen | H01M 2/1016 307/139 |
| 2011/0227418 | A1 * | 9/2011 | Pyboyina | H02J 9/062 307/75 |
| 2012/0025609 | A1 * | 2/2012 | West | H02J 9/062 307/31 |
| 2012/0175958 | A1 * | 7/2012 | Dighrasker | H02J 9/062 307/66 |
| 2013/0043804 | A1 | 2/2013 | Keong et al. | |
| 2013/0049699 | A1 * | 2/2013 | Jayaraman | H02M 1/10 320/137 |
| 2013/0063119 | A1 | 3/2013 | Lubomirsky | |
| 2013/0241291 | A1 | 9/2013 | Wang | |
| 2013/0329471 | A1 * | 12/2013 | Escobar | H02M 7/487 363/40 |
| 2014/0313804 | A1 * | 10/2014 | Urushibata | H02M 7/487 363/132 |
| 2015/0245531 | A1 | 8/2015 | Meinecke et al. | |

OTHER PUBLICATIONS

Hiroaki Kakigano et al., "Low-Voltage Bipolar-Type DC Microgrid for Super High Quality Distribution", IEEE Transactions on Power Electronics, vol. 25, No. 12, Dec. 2010, 10 pages.
Y. Nishida et al., "A New 3-phase Buck-Boost Unity Power Factor Rectifier with Two Independently Controlled DC Outputs", IEEE, 2007, 7 pages.
H. Kakigano et al., "DC Voltage Control of the DC Micro-grid for Super High Quality Distribution", IEEE, 2007, 8 pages.
Jackson Lago et al., "Evaluation of Power Converters to Implement Bipolar DC Active Distribution Networks—DC-DC Converters", IEEE, 2011, 6 pages.
U.S. Appl. No. 14/632,445, filed Feb. 26, 2015, Meinecke et al.
International Search Report and Written Opinion for International Application No. PCT/US2015/018777, date of mailing of the international search report Jun. 18, 2015, 9 pages.

* cited by examiner

POWER CONVERSION SYSTEM WITH CONTROLLED NEUTRAL

CROSS-REFERENCE TO RELATED APPLICATIONS

This application claims priority to U.S. Provisional Application No. 61/945,529, filed Feb. 27, 2014, the contents of which are incorporated by reference in their entirety.

BACKGROUND

The present invention relates generally to the field of electrical power conversion. The present invention relates more specifically to the conversion of Direct Current ("DC") electrical power from an input voltage source to at least one output voltage which is controlled in reference to a neutral voltage where the neutral voltage is controlled in reference to the actual ground voltage located proximate to the conversion system ("Earth Ground").

DC uninterruptible power supplies ("UPSs") are typically used in data centers which store data and provide computing for many uses such as local and remote computing, internet data handling, intranet data handling, cloud computing, storage, etc. UPSs are also used for other applications such as DC micro-grid applications having a narrow range of DC voltage capability. In addition to having a narrow range of DC voltage capability, these applications must be reliable and operate as efficiently as possible to reduce the power consumption and heat generated by such systems. Recently, there has been a trend to move data centers near power plants due to the amount of power used by data centers and also move data centers in geographic areas having cooler ambient temperatures and wind patterns which reduce the energy needed to cool (remove energy from) the data centers. Accordingly, improving the efficiency of electrical systems and data centers results in substantial cost savings as a result of increasing the quantity of computing for a given amount of energy and reducing the amount of cooling required for a given amount of computing.

Information technology loads such as a data servers, network switches, data storage, etc., are required to be grounded to the actual ground proximate to the device ("Earth Ground"). The neutral and ground of the device are coupled together at the device, and then the neutral/ground are coupled to the Earth Ground (e.g. ground terminal at a data warehouse) through power buses/conductors which inherently have impedance. This impedance is the result of the resistance, capacitance and inductance of the electrical path between the neutral/ground terminal at the device and the Earth Ground ("Impedance to Earth Ground"). Typically power is supplied to the devices by UPSs and other power supply sources along with conductors coupled to neutral and Earth Ground. Accordingly, depending upon the operation and components of the device, the voltage of the neutral/ground at the device can differ from the Earth Ground which causes a current flow from the neutral/ground to Earth Ground. This current flow generates a voltage difference related to the Impedance to Earth Ground and the current. There can be substantial energy lost as a result of this voltage imbalance and current flow between neutral/ground and Earth Ground. Additionally, this voltage difference can impact the operation of circuit protecting devices such as the circuit breaker used to protect for overload currents, ground faults, and short circuits in the power conductors/buses of a data center.

SUMMARY

One embodiment of the invention relates to a direct current (DC) voltage to DC voltage converter. The DC voltage to DC voltage converter includes a positive DC input terminal, a negative DC input terminal, a center point terminal, a positive DC output terminal, a negative DC output terminal, a neutral terminal, a positive DC output voltage controller, a negative DC output voltage controller and a neutral terminal voltage controller. The center point terminal is coupled to the positive DC input terminal by at least a first capacitance and coupled to the negative DC input terminal by at least a second capacitance. The neutral terminal is coupled to the positive DC output terminal by at least a first inductor and coupled to the negative DC output terminal by at least a second inductor. The positive DC output voltage controller is coupled to the positive DC input terminal, the positive DC output terminal, and the neutral terminal, to control the voltage of the positive DC output terminal relative to the neutral terminal based upon the current flow between the input and positive DC output terminals and the voltage between the positive DC output terminal and the neutral terminal. The negative DC output voltage controller is coupled to the negative DC input terminal, the negative DC output terminal, and the neutral terminal, to control the voltage of the negative DC output terminal relative to the neutral terminal based upon the current flow between the input and negative DC output terminals and the voltage between the negative DC output terminal and the neutral terminal. The neutral terminal voltage controller is coupled to the center point terminal, the neutral terminal and Earth Ground to minimize the difference in voltage potential between the neutral terminal voltage and the potential of Earth Ground, where Earth Ground is connectable to the ground of a building.

Another embodiment of the invention relates to an electrical power conversion circuit which generates output DC power at separate terminals referenced to a neutral terminal. The electrical power conversion circuit includes a first terminal to which a DC current is to be applied at a first voltage, a second terminal to which a DC current is to be applied at a second voltage different from the first voltage by an input voltage differential, a neutral terminal, a positive DC terminal, a negative DC terminal, a positive DC voltage controller and a negative DC voltage controller. The neutral terminal is coupled to the first terminal by a first inductor and a first capacitor and coupled to the second terminal by the first inductor and a second capacitor. The positive DC terminal is coupled to the first terminal by at least a second inductor and a first switch having a first control input, and coupled to the neutral terminal by the second inductor and a second switch having a second control input. The negative DC terminal is coupled to the second terminal by at least a third inductor and a third switch having a third control input, and coupled to the neutral terminal by the third inductor and a fourth switch having a fourth control input. The positive DC voltage controller to which a first signal representative of a first voltage differential between the positive DC terminal and the neutral terminal, and a second signal representative of a current flow between the positive DC terminal and the first terminal are applied, the positive DC voltage controller including first and second control outputs coupled to the first and second control inputs, respectively, to control the differential voltage between the positive DC terminal and the neutral terminal within a predetermined range. The negative DC voltage controller to which a third signal representative of a second voltage differential between the negative DC terminal and the neutral terminal, and a fourth signal representative of a current flow between the negative DC terminal and the second terminal are applied, the negative DC voltage controller including third and fourth control outputs coupled to the third and fourth control inputs, respectively, to control the differential voltage between the negative DC terminal and the neutral terminal within a predetermined range, wherein the input voltage range is greater than the sum of the first and second voltage differentials.

Another embodiment of the invention relates to an electrical power conversion circuit which generates output DC power at separate terminals referenced to a neutral terminal, wherein the voltage differential between the neutral terminal and Earth Ground is controlled. The electrical power conversion circuit includes a positive DC input terminal, a negative DC input terminal, a center point terminal, means for coupling the positive DC input terminal to the center point terminal, means for coupling the negative DC input terminal to the center point terminal, a positive DC output terminal, a negative DC output terminal, a neutral terminal, an Earth Ground terminal connectable to the ground of a building, means for coupling the neutral terminal to the center point terminal, means for coupling the positive DC output terminal to the positive DC input terminal and the neutral terminal, means for coupling the negative DC output terminal to the negative DC input terminal and the neutral terminal, means for controlling a positive voltage differential between the positive DC output terminal and the neutral terminal based upon a signal representative of the current flow between the positive DC input and output terminals and a signal representative of the positive voltage differential, means for controlling a negative voltage differential between the negative DC output terminal and the neutral terminal based upon a signal representative of the current flow between the negative DC input and output terminals and a signal representative of the negative voltage differential and means for controlling a neutral voltage differential between the neutral terminal and the Earth Ground terminal based upon a signal representative of the voltage differential between the center point terminal and the Earth Ground terminal and a signal representative of the voltage differential between the neutral terminal and Earth Ground terminal.

In another embodiment, the converter also includes a first capacitor and a first inductor coupled between the neutral terminal and the positive DC output terminal.

In another embodiment, the converter also includes a second capacitor and a second inductor coupled between the neutral terminal and the negative DC output terminal.

In another embodiment, the neutral terminal voltage controller includes a voltage sensor coupled between the neutral terminal and Earth Ground, and the output of the voltage sensor.

Alternative exemplary embodiments relate to other features and combinations of features as may be generally recited in the claims.

BRIEF DESCRIPTION OF THE DRAWINGS

This application will become more fully understood from the following detailed description, taken in conjunction with the accompanying figures, wherein like reference numerals refer to like elements.

DETAILED DESCRIPTION

The embodiments illustrated and described are representative of the operative sub-systems of a direct current uninterruptible power system (DC UPS). Embodiments of the direct current (DC) converter utilize a neutral output control that allows for return current to be sourced back to the converter. Preferred embodiments of the system are configured to manage and/or control the system neutral relative to the DC output voltages and Earth Ground based, in part, upon the return current. When DC power is distributed in power system for a facility such as a data center, the system provides output DC voltage to power buses including a neutral potential, a positive DC voltage relative to the neutral, a negative DC voltage relative to the neutral, and Earth Ground as a reference for the neutral. Selecting the components of the system provides system modifications to accommodate operation across a number of voltage ranges and system power requirements. In addition to the value of the DC voltage conversion and neutral control to a DC UPS system, this type of conversion and control would be valuable for use in other DC power systems wherein the final DC to DC conversion is configured to accommodate the DC voltage needs for any of the loads on the system e.g. LED lighting powered from a common DC power supply which distributes power (e.g. at 1.5 volts or multiple thereof) to a plurality of LED lights (without individual power conversion or supply circuits), computers powered from a common DC power supply which distributes power (e.g. at 12 volts) to a plurality of computers or servers.)

Figure 1:
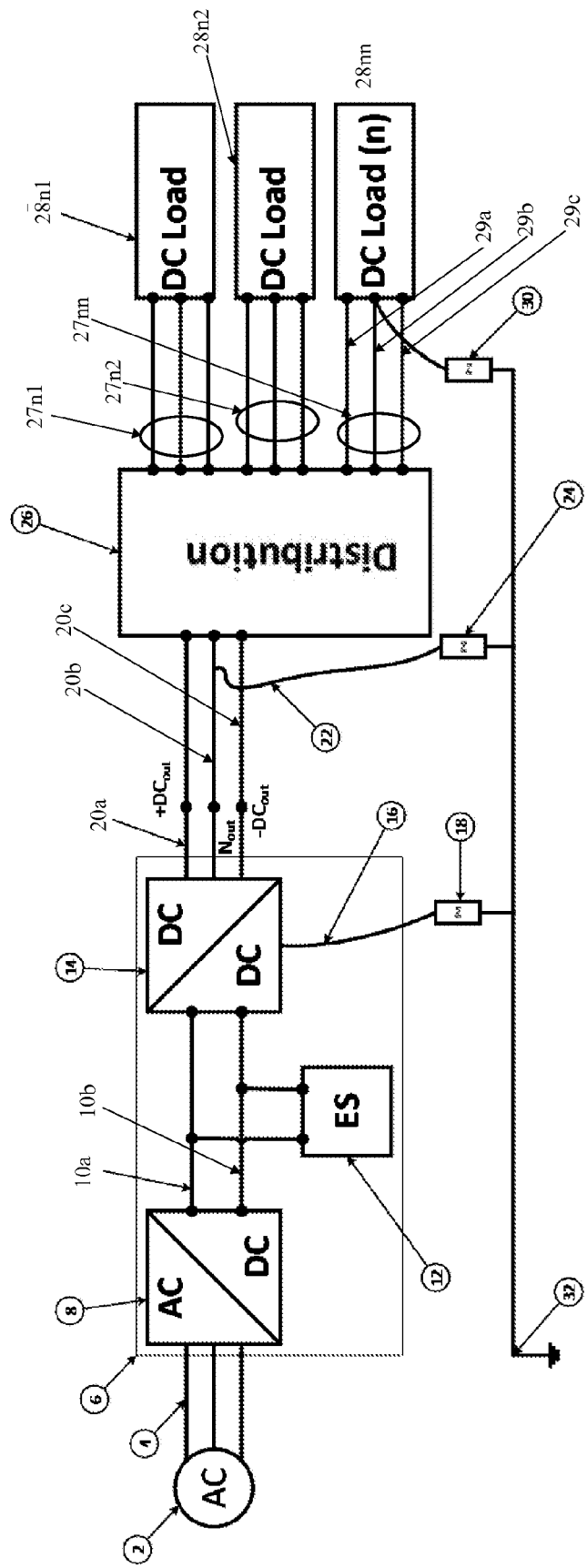
FIG. 1 is a system diagram illustrating supply of electrical power to computers (e.g. data servers) in a data center, where the electrical power is converted from alternating electrical power ("AC") to DC power which can be more efficiently used by the computers.

Referring to FIG. 1, an embodiment of a DC UPS is illustrated. The DC UPS shown includes:

Alternating current input source 2, which for a majority of data centers would be 480 volt (hereinafter "volt" or "v"), three-phase, alternating current (AC);

Alternating current input connection or distribution 4, which would typically include an AC load center including appropriate circuit protection (e.g. three-phase circuit breakers) coupled between the AC supply and AC wiring or an AC power busway;

Direct Current Un-interruptible Power System (DC UPS) 6, which in a preferred embodiment for a data center would be constructed in modular form to include multiple systems each supported within a rack (represented by the rectangle indicated at the arrow from no. 6) having form factor and frame construction the same as or similar to the racks supporting the servers in the data center;

Alternating current to direct current conversion stage 8, which, for purposes of the preferred embodiment, would be the type of a conversion system commonly used in data centers to convert the AC supply to DC voltage to power the energy storage with DC power;

Internal DC power bus 10*a* and 10*b*;
Energy storage system 12;
Earth Ground terminal 32;

Direct current to direct current conversion stage 14 (see details discussed below in FIGS. 5 and 6 for preferred embodiment) which has its ground terminal 16 coupled to terminal 32 with a ground impedance 18;

Output power conductors (+190 volts DC, neutral, −190 volts DC) 20*a*, 20*b*, 20*c* of stage 14, wherein neutral conductor 20*b* is coupled to terminal 32 by impedance 24;

Distribution system 26, which would typically include a load center including appropriate circuit protection (e.g. two phase DC-rated circuit breakers for each branch circuit) coupled between the conductors 20*a*, 20*b* and 20*c*, and DC wiring or DC power busways which define each branch circuit 27*n*1, 27*n*2, 27*nn*;

Output power conductors (+190 volts DC, neutral, −190 volts DC) 29*a*, 29*b*, 29*c* for each branch circuit wherein the neutral conductor 29*b* is coupled to terminal 32 by an impedance 30;

DC loads 28*n*1, 28*n*2, 28*n*, which in the preferred embodiments would be the DC to DC conversions circuits which convert the +/−190 volts DC to 12 volts DC for providing 12 volts DC power to computers and servers supported by server racks.

The component and circuit symbols used in FIG. 1 are industry standard symbols.

In the preferred embodiment, stage 8 is a conversion circuit which converts 3-phase 480 volt alternating current (AC) power to DC power with a voltage in the range of 500 to 1000 volts with a typical nominal voltage of 720 volts. DC power is applied to the energy storage unit 12 via conductors 10*a* and 10*b*. Storage unit 12 operates to store electrical energy at the nominal voltage generated between conductors 10*a* and 10*b*, and also operates to remove AC components from the DC power supplied from stage 8 to conversion stage 14. Unit 12 is preferably in the form of batteries arranged in series to match the DC output voltage from stage 8. The storage unit 12 batteries may be lead acid; lithium-based, nickel-based, or could take the form of capacitors wherein the capacity of the unit 12 components are sized to provide enough energy to power the data center when the 480 volt AC power is temporarily lost or until backup generation is available to power the data center. It is contemplated that the storage unit will use a storage media which is selected by the system integrator of a data center based upon the cost and current state of the technology for commercially available electrical energy storage having the voltage and power capacities suitable for a particular data center.

FIGS. 5, 5A, 6, and 10 illustrate preferred embodiments for conversion stage 14 which converts the DC power from stage 8 into DC power at +/−190 volts applied to terminals 20*a* and 20*c*, respectively, in reference to neutral terminal 20*b* and ground terminal 32. As discussed above, the +/−190 volt terminals are connected to a distribution system 26 which includes a load center having circuit protection e.g. 2 or 3 pole, DC circuit breakers for each branch circuits 27*n*1, 27*n*2, 27*nn*. These branch circuits may be made up of electrical wiring and/or power busways which supply electrical power to DC loads 28*n*1, 28*n*2, 28*nn* such as the power supplies for servers in server racks. In the present embodiment, the power supplies include DC to DC converters which convert the +/−190 volt DC power into 12 volt DC power usable by a typical computer server. In a preferred embodiment a plurality of such DC to DC converters would be connected to the power bus bars of a server rack to provide shared-power sources for all of the servers in the rack which are powered by a particular power bus in the rack. Alternatively each server may have its own DC to DC converter as a source of power. By way of example only, the DC to DC converters used to provide 12 volt DC power to the servers can be a single chip DC to DC converter of the type used for certain electric automobile applications when combined with appropriate output power conditioning/filtering.

Figure 2:
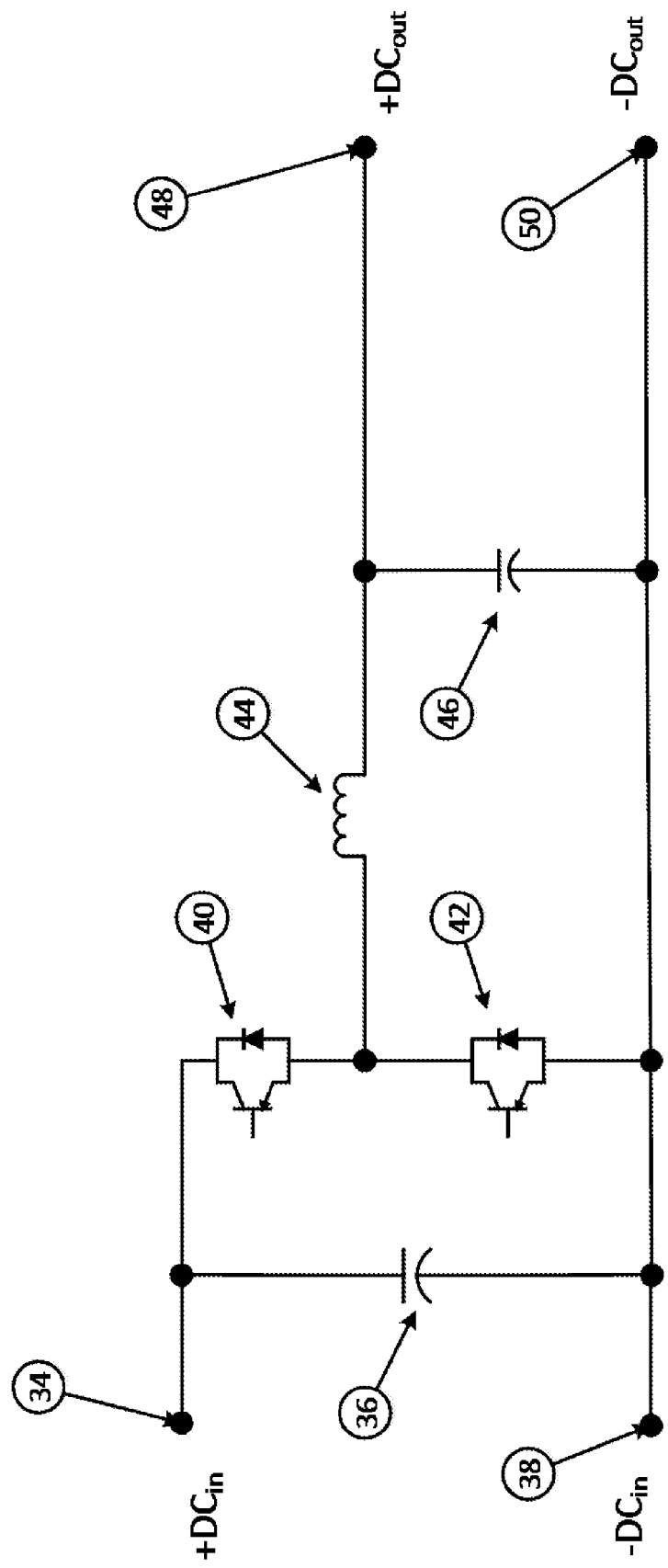
FIG. 2 illustrates an embodiment of a DC to DC converter without control circuitry for controlling a neutral relative to Earth Ground.

FIG. 2 illustrates a DC to DC buck converter implemented utilizing dual insulated-gate bipolar transistor (IGBT) technology. The buck converter does not include a controlled neutral, and operates using the following components coupled as shown in FIG. 2:

Positive DC input terminal 34,
Negative DC input terminal 38,
Capacitive energy storage element 36,
Upper leg switching semiconductor device 40,
Lower leg switching semiconductor device 42,
Inductive element 44,
Capacitive energy storage element 46,
Positive DC output terminal 48, and
Negative DC output terminal 50.

The component and circuit symbols used in FIG. 2 are industry standard symbols.

Depending upon the particular electrical architecture used in a data center or for other applications of the system e.g. LED lighting power, the DC to DC converter shown in FIG. 2 may be used in place of a preferred converter having output voltages and a neutral controlled relative to each other and ground. When used as the system DC to DC converter for stage 14, terminal 34 would be connected to 10*a*, terminal 38 to 10*b*, terminal 48 to 20*a* and terminal 50 to 20*c*. Because the circuit of FIG. 2 operates only on the voltage differential between input terminals 34 and 38, additional circuitry would be required to generate a neutral point for the system relative to an earth ground and based upon the system requirements.

Figure 3:
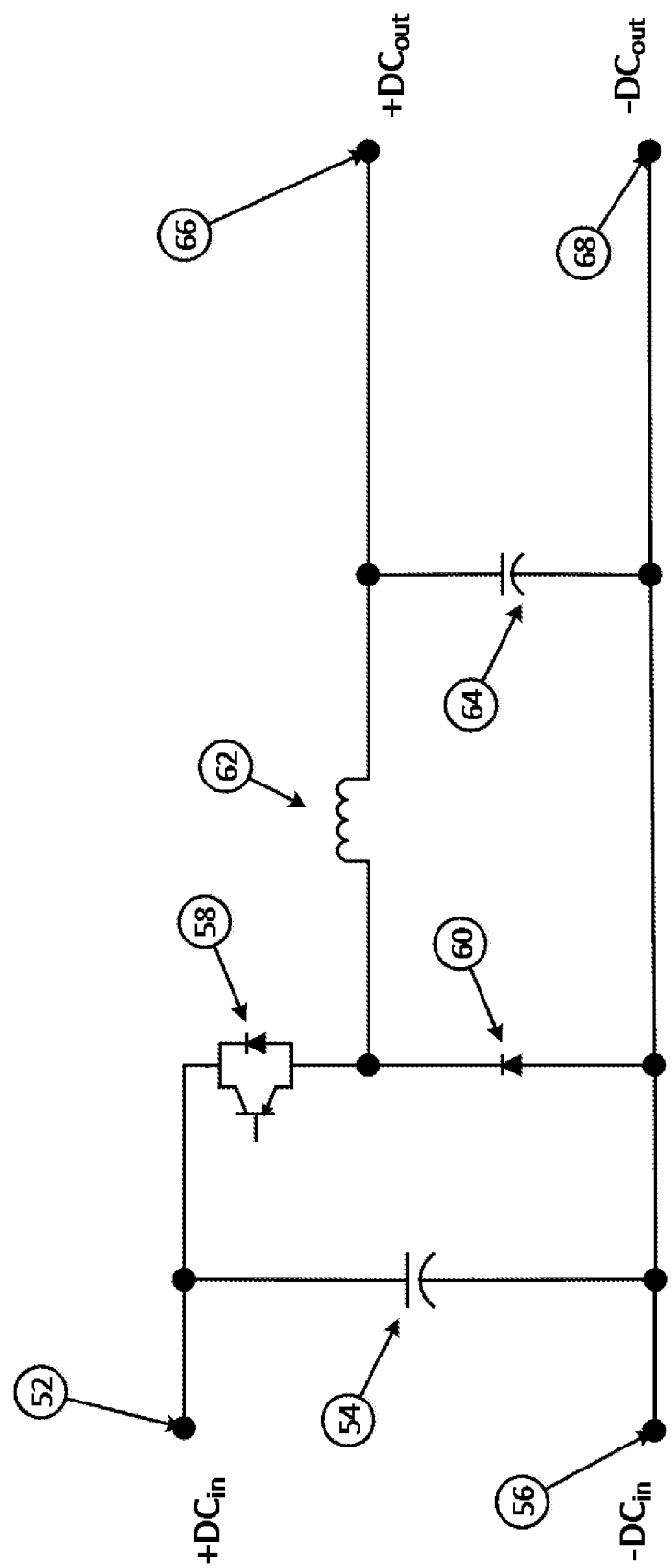
FIG. 3 illustrates an embodiment of a DC to DC converter without control circuitry for controlling a neutral relative to Earth Ground.

FIG. 3 illustrates a DC to DC buck converter implemented utilizing single IGBT and diode technology. Referring to FIG. 3, the DC to DC converter does not included a controlled neutral, and operates using the following components coupled as shown in FIG. 3:

Positive DC input terminal 52,
Negative DC input terminal 56,
Capacitive energy storage element 54,
Upper leg switching semiconductor device 58,
Lower leg diode semiconductor device 60,
Inductive element 62,
Capacitive energy storage element 64,
Positive DC output terminal 66, and
Negative DC output terminal 68.

The component and circuit symbols used in FIG. 3 are industry standard symbols.

Depending upon the particular electrical architecture used in a data center or for other applications of the system e.g. LED lighting power, the DC to DC converter shown in FIG. 3 may be used in place of a preferred converter having output voltages and a neutral controlled relative to each other and ground. When used as the system DC to DC converter for stage 14, terminal 52 would be connected to 10a, terminal 56 to 10b, terminal 66 to 20a and terminal 68 to 20c. Because the circuit of FIG. 3 operates only on the voltage differential between input terminals 52 and 56, additional circuitry would be required to generate a neutral point for the system relative to earth ground 32 and based upon the system requirements.

Figure 4:
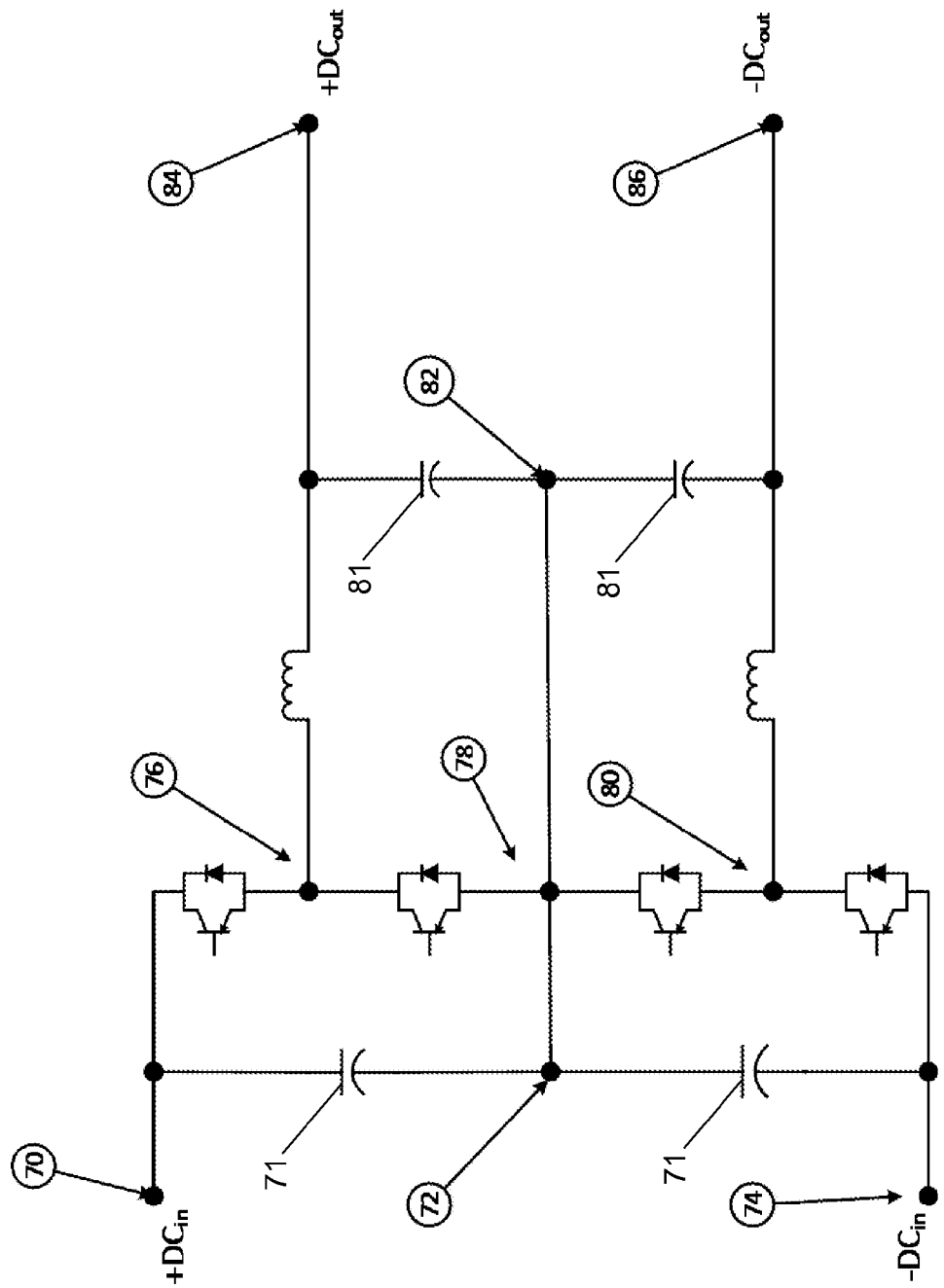
FIG. 4 illustrates an embodiment of a DC to DC converter without control circuitry for controlling a neutral relative to Earth Ground.

FIG. 4 illustrates a bi-polar DC/DC buck converter that symmetrically bucks voltage from a higher voltage DC source to a lower output voltage and also does not include a controlled neutral. Referring to FIG. 4, the DC to DC converter shown includes:

Positive DC input terminal 70,
Capacitive energy storage elements 71,
Center-point of capacitive energy storage elements 72,
Negative DC input terminal 74,
Center-point of upper leg switching semiconductor devices 76,
Center-point of stacked semiconductor devices 78,
Center-point of lower leg switching semiconductor devices 80,
Capacitive energy storage elements 81,
Center-point of capacitive energy storage elements 82,
Positive DC output terminal 84, and
Negative DC output terminal 86.

The component and circuit symbols used in FIG. 4 are industry standard symbols.

Depending upon the particular electrical architecture used in a data center or for other applications of the system e.g. LED lighting power, the DC to DC converter shown in FIG. 4 may be used in place of a preferred converter having output voltages and a neutral controlled relative to each other and ground. When used as the system DC to DC converter for stage 14, terminal 70 would be connected to 10a, terminal 74 to 10b, terminal 84 to 20a and terminal 86 to 20c. Because the circuit of FIG. 4 operates only on the voltage differential between input terminals 52 and 56, additional circuitry would be required to generate a neutral point for the system relative to earth ground 32, and based upon the voltage at terminal 82 and the system requirements.

The converters illustrated in FIGS. 2-4 are configured to operate from a DC input bus at a voltage higher than the desired DC voltage. This voltage is then stepped down through the converter to a lower DC voltage by switching power devices and inductors.

Unlike the converters illustrated in FIGS. 2-4, the DC to DC converters described in detail below provide voltage balancing that allows the system to maintain positive and negative DC voltages relative to ground during fault events. This is accomplished by converting the DC power applied to 10a and 10b to power in the form of a positive DC voltage applied to 20a, negative DC voltage applied to 20c wherein the differential voltage between neutral 20b and 20a, neutral 20b and 20c and neutral 20b and ground 32 are controlled so the differential voltages remain constant e.g. +190 volts between 20a and 20b, −190 volts between 20b and 20c and 0 volts between neutral 20b and ground 32.

A constant differential is defined in terms of the operational requirements of the system. For example, in a data center, proper operation of the circuit protection (e.g. circuit breakers) for overload, short circuit and ground fault protection ideally requires that the differential not vary if possible, but if it varies, the amplitude of the variation is relatively small and the frequency of the variation is at a frequency sufficiently high not to adversely affect the proper operation of the system circuit protection. This type of balancing also provides improved performance and efficiency in electrical loads (e.g. server power supplies) powered by the converter. In addition to the computers/servers in a data center, these loads can include micro-grid components, LED system applications, or electric vehicle fast chargers.

Figure 5:
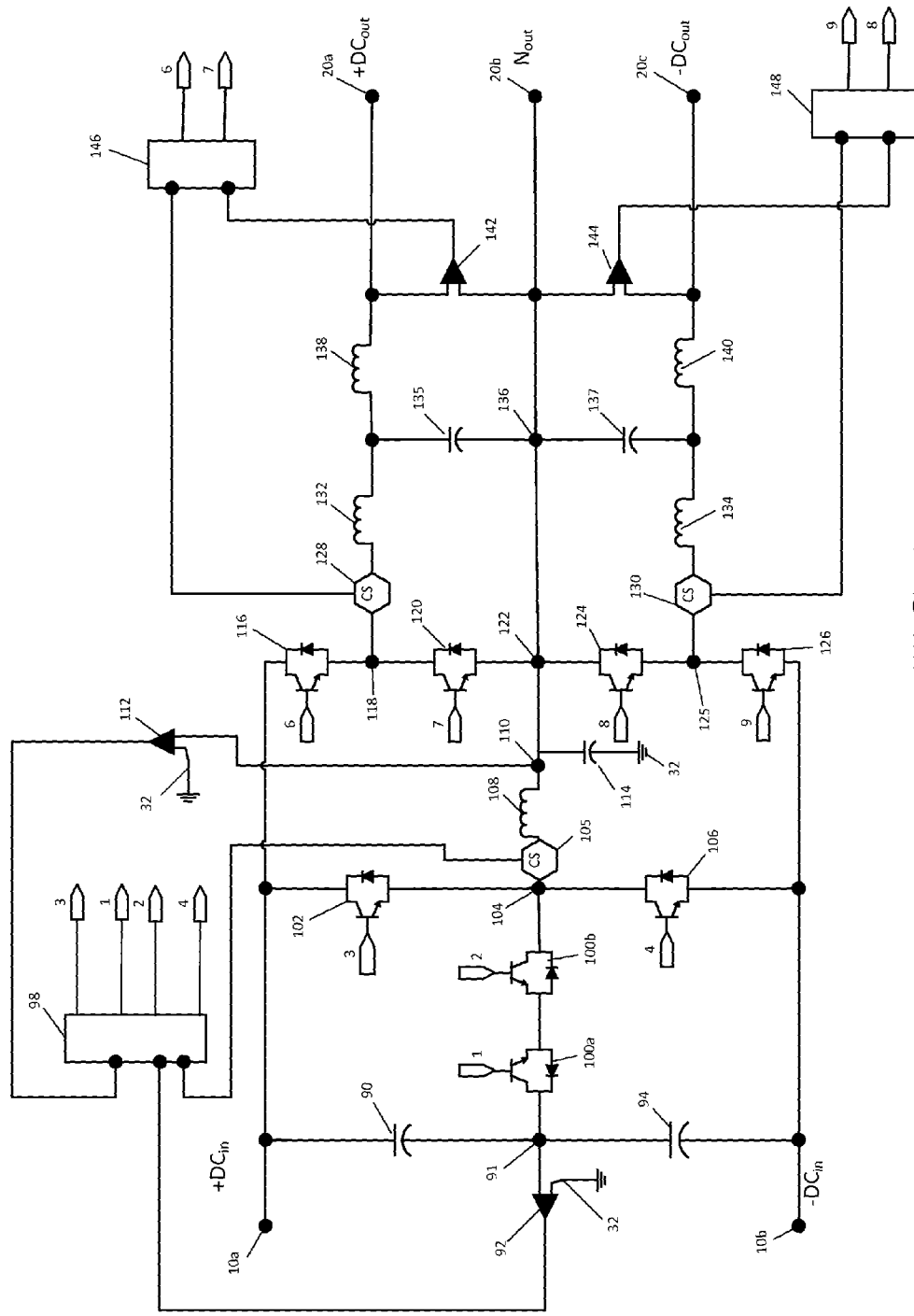
FIG. 5 illustrates a first embodiment of a DC to DC converter with a neutral controlled relative to Earth Ground and DC voltages controlled relative to the neutral.

FIG. 5 illustrates a first embodiment of a preferred DC to DC converter 14 which is contemplated for use in the system discussed in reference to FIG. 1. Unlike the prior art buck converters illustrated in FIGS. 2-4, the converter of FIG. 5 has a circuit design which provides a neutral potential terminal controlled in reference to ground 32 and the +/− output DC voltages. The first embodiment of converter/stage 14 includes the following components coupled as shown in FIG. 5.

Positive DC input terminal 10a,
Upper leg capacitive energy storage element 90,
Center point 91,
Center point voltage to ground sensor 92,
Lower leg capacitive energy storage element 94,
Negative DC input terminal 10b,
Neutral point regulator circuit (i.e. neutral voltage controller) 98,
Neutral leg switching devices for neutral point regulator circuit 100a and 100b,
Upper leg switching devices for neutral point regulator circuit 102,
Connection node for neutral point regulator circuit 104,
Neutral regulator current sensor 105,
Lower leg switching devices for neutral point regulator circuit 106,
Inductive element for neutral point regulator 108,
Node for neutral point voltage to ground sensor connection 110,
Neutral point voltage to ground sensor 112,
Capacitive energy storage element to ground for neutral point regulator circuit 114,
Upper half—upper leg switching device for output stage 116,
Connection node for output stage 118,
Upper half—lower leg switching device for output stage 120,
Connection node for neutral system 122,
Lower half—upper leg switching device for output stage 124,
Connection node for output stage 125,
Lower half—lower leg switching device for output stage 126,
Upper leg output control current sensor 128,
Lower leg output control current sensor 130,
Upper leg output inductive element 132,
Lower leg output inductive element 134,
Capacitor 135,
Connection node for neutral system output side 136,
Capacitor 137,
Upper leg output secondary inductive element 138,
Lower leg output secondary inductive element 140,
Output positive rail voltage to neutral point sensor 142,
Output negative rail voltage to neutral point sensor 144,
Output positive phase/leg voltage controller 146,
Output negative phase/leg voltage controller 148,
Positive DC output terminal 20a,
Neutral terminal 20b, and
Negative DC output terminal 20c.

The component and circuit symbols used in FIG. 5 are industry standard symbols.

Figure 5A:
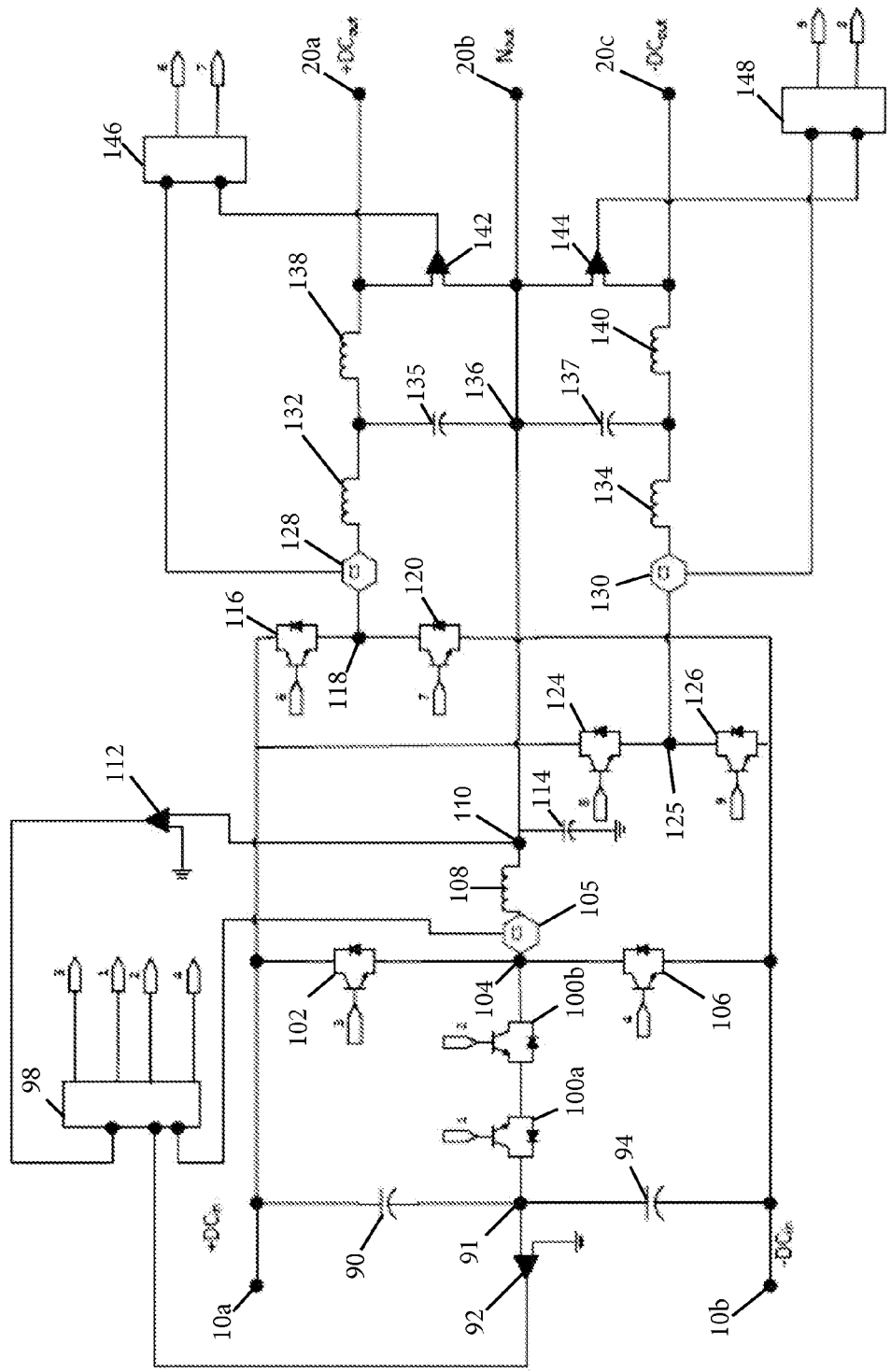
FIG. 5A illustrates a second embodiment of a DC to DC converter with a neutral controlled relative to Earth Ground and DC voltages controlled relative to the neutral.

FIG. 5A illustrates a second embodiment of a preferred DC to DC converter 14 which is contemplated for use in the system discussed in reference to FIG. 1. In particular, FIG. 5A illustrates a dual half-bridge implementation of the converter. The second embodiment of converter/stage 14 includes the following components coupled as shown in FIG. 5A.

Positive DC input terminal 10a,
Upper leg capacitive energy storage element 90,
Center point 91,
Center point voltage to ground sensor 92,
Lower leg capacitive energy storage element 94,
Negative DC input terminal 10b,
Neutral point regulator circuit (i.e. neutral voltage controller) 98,
Neutral leg switching devices for neutral point regulator circuit 100a and 100b,
Upper leg switching devices for neutral point regulator circuit 102,
Connection node for neutral point regulator circuit 104,
Neutral regulator current sensor 105,
Lower leg switching devices for neutral point regulator circuit 106,
Inductive element for neutral point regulator circuit 108,
Node for neutral point voltage to ground sensor connection 110,
Neutral point voltage to ground sensor 112,
Capacitive energy storage element to ground for neutral point regulator circuit 114,
Upper half—upper leg switching device for output stage 116,
Connection node for output stage 118,
Upper half—lower leg switching device for output stage 120,
Lower half—upper leg switching device for output stage 124,
Connection node for output stage 125,
Lower half—lower leg switching device for output stage 126,
Upper leg output control current sensor 128,
Lower leg output control current sensor 130,
Upper leg output inductive element 132,
Lower leg output inductive element 134,
Capacitor 135,
Connection node for neutral system output side 136,
Capacitor 137,
Upper leg output secondary inductive element 138,
Lower leg output secondary inductive element 140,
Output positive rail voltage to neutral point sensor 142,
Output negative rail voltage to neutral point sensor 144,
Output positive phase/leg voltage controller 146,
Output negative phase/leg voltage controller 148,
Positive DC output terminal 20a,
Neutral terminal 20b, and
Negative DC output terminal 20c.

The component and circuit symbols used in FIG. 5A are industry standard symbols.

Circuit 98 (shown and described in detail in reference to FIG. 7), controller 146 (shown and described in detail in reference to FIG. 8) and controller 148 (shown and described in detail in reference to FIG. 9) operate to control the voltage differential between neutral 20b and ground 32 in conjunction with maintaining the voltage differential between the output DC voltages between 20a and 20b and 20b and 20c, respectively. There are 3 non-set point inputs to circuit 98. The first is the output of a voltage sensor 92 which operates as a center point sensor. In particular, voltage sensor 92 generates a signal representative of the voltage differential between ground 32 and the center point voltage 91 between the positive DC voltage 10a and the negative DC voltage 10b and applies this signal to circuit 98. The second input is the output of a voltage sensor 112 which operates as a neutral point sensor. In particular, voltage sensor 112 generates a signal representative of the voltage differential between ground 32 and the neutral voltage 20b between the positive DC voltage 20a and the negative DC voltage 20c and applies this signal to circuit 98. The third input is the output of current sensor 105. In particular, current sensor 105 generates a signal representative of the current flow through inductor 108 and applies this signal to circuit 98.

There are 2 non-set point inputs to controller 146. The first is the output of a voltage sensor 142 which generates a signal representative of the voltage differential between positive DC voltage 20a and neutral 20b and applies this signal to controller 146. The second input is the output of current sensor 128 which applies a signal to controller 146. There are also 2 non-set point inputs to controller 148. The first is the output of a voltage sensor 144 which generates a signal representative of the voltage differential between positive DC voltage 20c and neutral 20b and applies this signal to controller 148. The second input is the output of current sensor 130, which applies a signal to controller 148.

Figure 7:
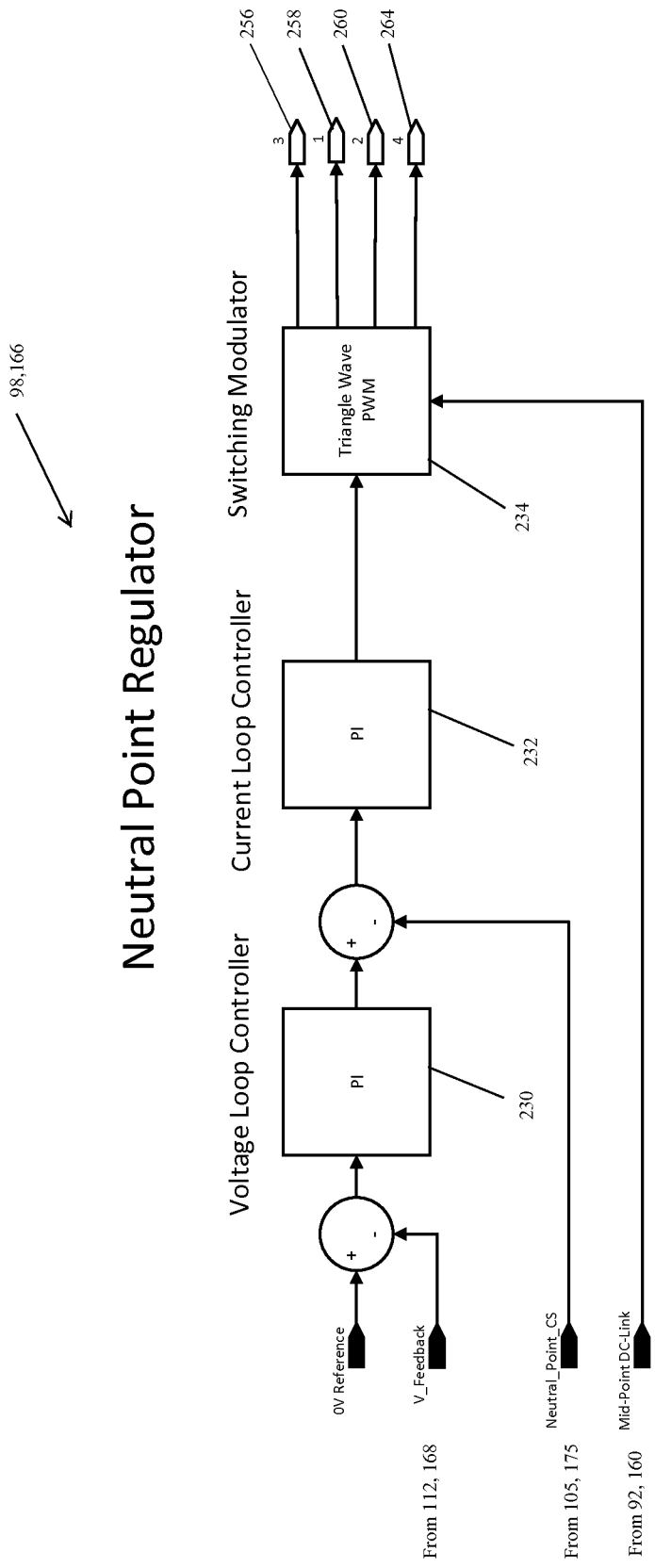
FIG. 7 illustrates a circuit diagram for a DC neutral point controller.

Circuit 98 includes 4 outputs 1, 2, 3 and 4 which are connected to the respective gates of switches 100a, 100b, 102 and 106. The switches are controlled by circuit 98 based upon i) the 2 non-set point input voltages from 92 and 112; ii) logic which provides control appropriate for a particular application; and iii) an input from current sensor 105 which generates a signal representative of the current in inductor 108. FIG. 7, described in detail below, illustrates a preferred embodiment of such control useable for purposes of providing DC power in a data center.

Figure 8:
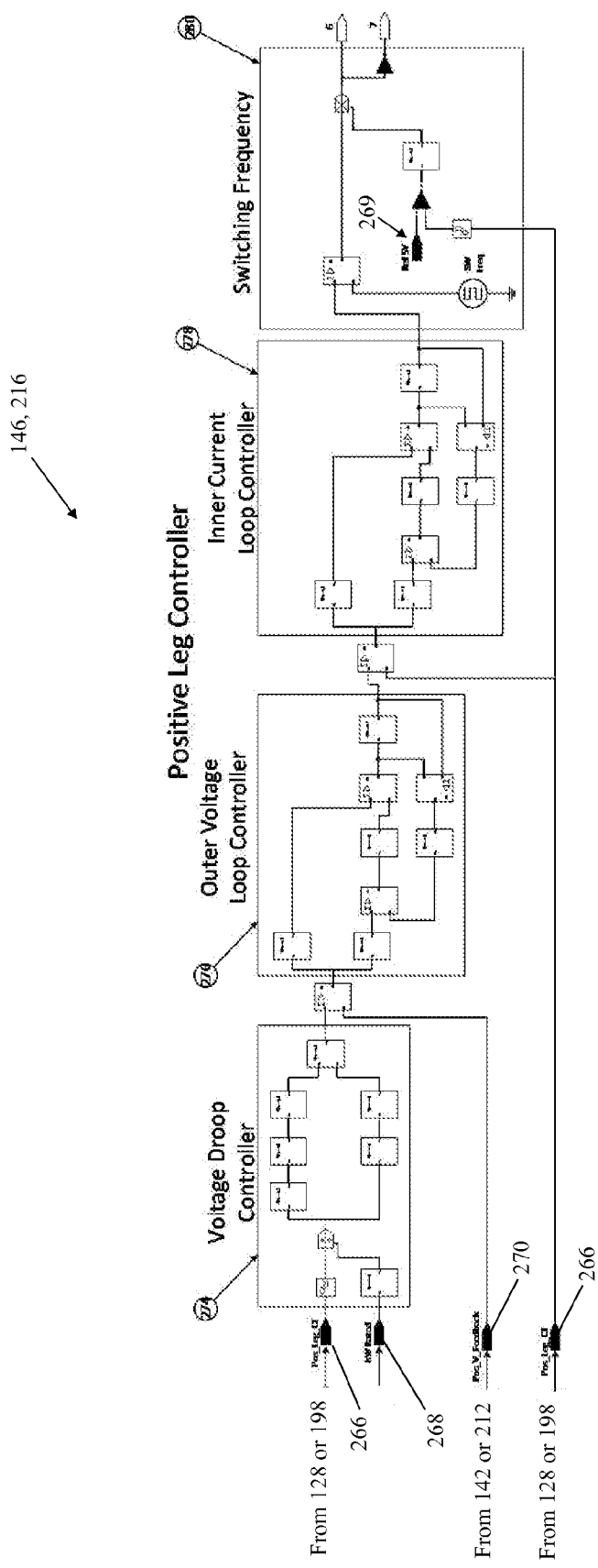
FIG. 8 illustrates a circuit diagram for a positive DC output voltage controller.
Figure 9:
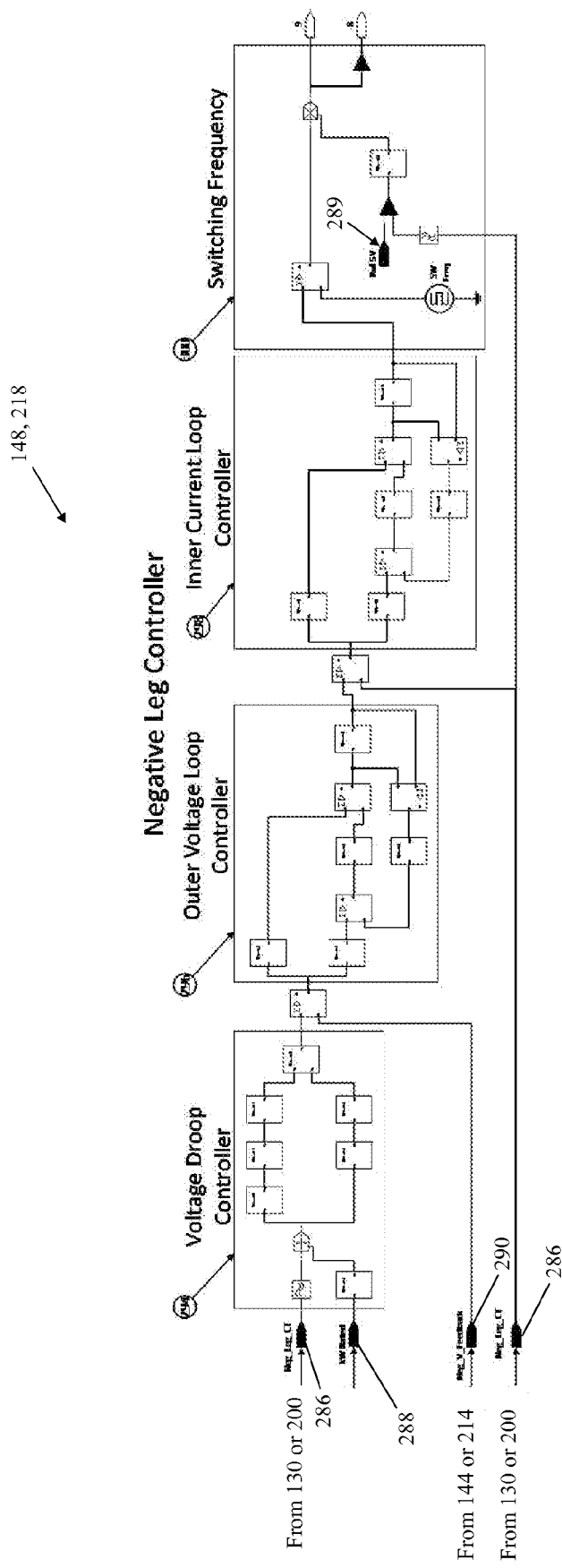
FIG. 9 illustrates a circuit diagram for a negative DC output voltage controller.

Controllers 146 and 148 include 2 outputs each, 6 and 7, and 8 and 9, respectively, which are connected to the respective gates of switches 116, 120, 124, and 126. Switches 116 and 118 are controlled by controller 146 based upon i) the 2 non-set point input voltages from 142 and 128; ii) the power rating input (see FIG. 8, 268); iii) a signal representative of a current limit threshold (see, e.g. FIG. 8, 269); and iv) logic which provides control appropriate for a particular application. FIG. 8, described in detail below, illustrates a preferred embodiment of such logic useable for purposes of providing DC power in a data center. Switches 124 and 126 are controlled by controller 148 based upon i) the 2 non-set point input voltages from 144 and 130; ii) the power rating input (see FIG. 9, 288); iii) a signal representative of a current limit threshold (see, e.g. FIG. 9, 289); and iv) logic which provides control appropriate for a particular application. FIG. 9, described in detail below, illustrates a preferred embodiment of such control useable for purposes of providing DC power in a data center.

In operation, circuit 98, controller 146 and controller 148 control the gates of the respective switches based upon the respective inputs and set points to i) maintain the voltage differential between neutral 20c and ground 32 constant (as defined above) at 0 volts, and ii) maintain the voltage differential between positive voltage 20a and neutral 20b, and negative voltage 20c and neutral 20b at a constant (as defined above) system voltage differential (e.g. +190 volts and −190 volts).

Figure 6:
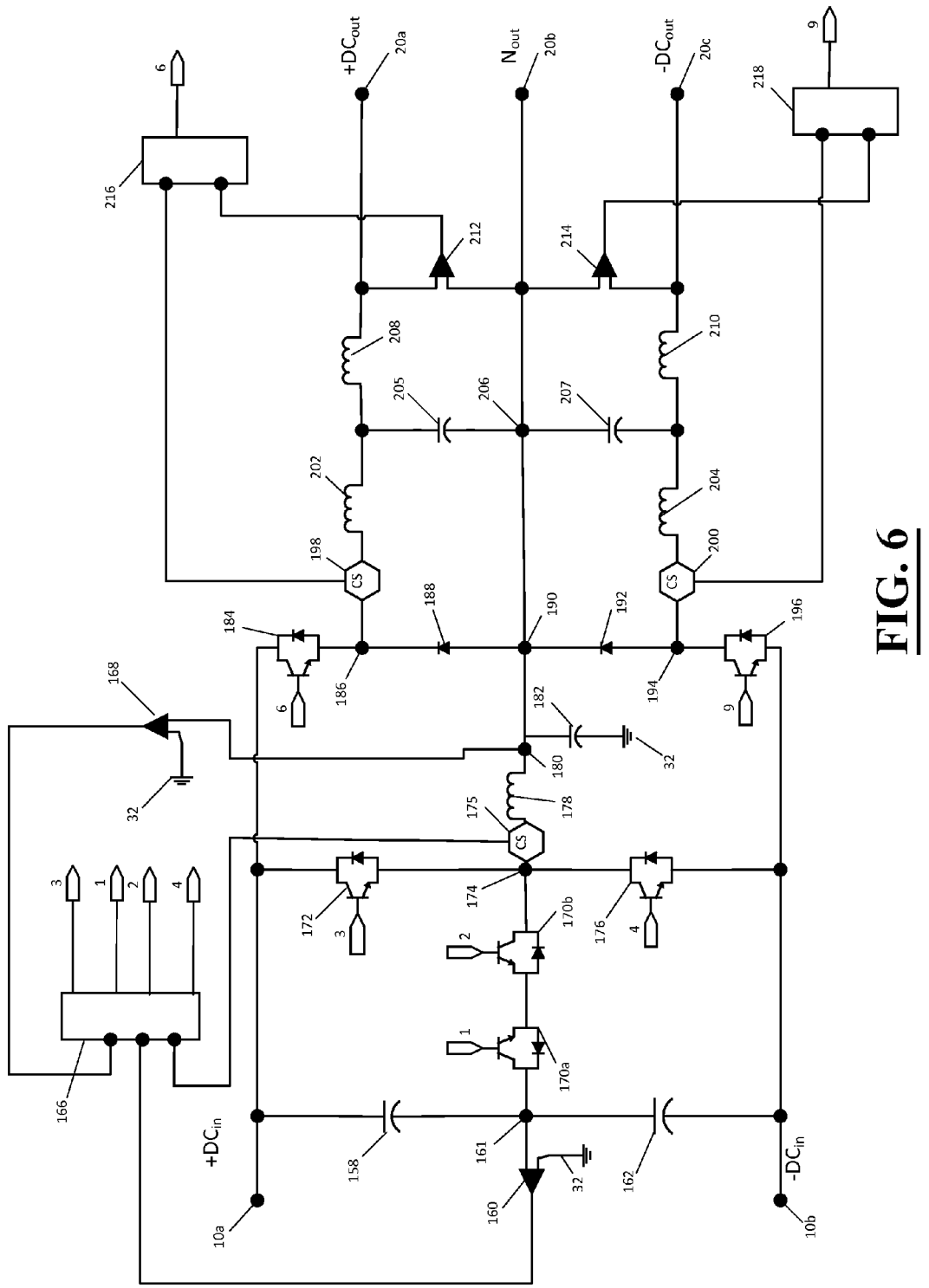
FIG. 6 illustrates a third embodiment of a DC to DC converter which has a neutral controlled relative to Earth Ground and DC voltages controlled relative to the neutral.

FIG. 6 illustrates a third embodiment of a preferred DC to DC converter/stage 14 which is contemplated for use in the system discussed in reference to FIG. 1. Unlike the prior art buck converters illustrated in FIGS. 2-4, the converter of FIG. 6 has a circuit design which provides a neutral potential terminal controlled in reference to ground 32 and the +/− output DC voltages. This embodiment of converter/stage 14 includes the following components coupled as shown in FIG. 6:

Positive DC input terminal 10*a*,
Upper leg capacitive energy storage element 158,
Center point voltage to ground sensor 160,
Center point 161,
Lower leg capacitive energy storage element 162,
Negative DC input terminal 10*b*,
Neutral point regulator circuit (i.e. neutral voltage controller) 166,
Neutral point voltage to ground sensor 168,
Neutral leg switching devices for neutral point regulator circuit 170*a* and 170*b*,
Upper leg switching devices for neutral point regulator circuit 172,
Connection node for neutral point regulator circuit 174,
Neutral regulator current sensor 175,
Lower leg switching devices for neutral point regulator circuit 176,
Inductive element for neutral point regulator circuit 178,
Node for neutral point voltage to ground sensor connection 180,
Capacitive energy storage element to ground for neutral point regulator circuit 182,
Upper half—upper leg switching device for output stage 184,
Connection node for output stage 186,
Upper half—lower leg diode device for output stage 188,
Connection node for neutral system 190,
Lower half—upper leg diode device for output stage 192,
Connection node for output stage 194,
Lower half—lower leg switching device for output stage 196,
Upper leg output control current sensor 198,
Lower leg output control current sensor 200,
Upper leg output inductive element 202,
Lower leg output inductive element 204,
Capacitor 205,
Connection node for neutral system output side 206,
Capacitor 207,
Upper leg output secondary inductive element 208,
Lower leg output secondary inductive element 210,
Output positive rail voltage to neutral point sensor 212,
Output negative rail voltage to neutral point sensor 214,
Output positive phase/leg voltage controller 216,
Output negative phase/leg voltage controller 218,
Positive DC output terminal 20*a*,
Neutral terminal 20*b*, and
Negative DC output terminal 20*c*.

The component and circuit symbols used in FIG. 6 are industry standard symbols.

Circuit 166 (also shown and described in detail in reference to FIG. 7), controller 216 (also shown and described in detail in reference to FIG. 8) and controller 218 (also shown and described in detail in reference to FIG. 9) operate to control the voltage differential between neutral 20*b* and ground 32 in conjunction with maintaining the voltage differential between the output DC voltages between 20*a* and 20*b* and 20*b* and 20*c*, respectively. There are 2 non-set point inputs to circuit 166. The first is the output of a voltage sensor 160 which operates as a center point sensor. In particular, voltage sensor 160 generates a signal representative of the voltage differential between ground 32 and the center point voltage 161 between the positive DC voltage 10*a* and the negative DC voltage 10*b* and applies this signal to circuit 166. The second input is the output of a voltage sensor 168 which operates as a neutral point sensor. In particular, voltage sensor 168 generates a signal representative of the voltage differential between ground 32 and the neutral voltage 20*b* between the positive DC voltage 20*a* and the negative DC voltage 20*c* and applies this signal to circuit 166. The third input is the output of current sensor 175. In particular, current sensor 175 generates a signal representative of the current flow through inductor 178 and applies this signal to circuit 166.

There are 2 non-set point inputs to controller 216. The first is the output of a voltage sensor 212 which generates a signal representative of the voltage differential between positive DC voltage 20*a* and neutral 20*b* and applies this signal to controller 216. The second input is the output of current sensor 198 which applies a signal to controller 216. There are also 2 non-set point inputs to controller 218. The first is the output of a voltage sensor 214 which generates a signal representative of the voltage differential between positive DC voltage 20*c* and neutral 20*b* and applies this signal to controller 218. The second input is the output of current sensor 200 which applies a signal to sensor 218.

Circuit 166 includes 4 outputs 1, 2, 3 and 4 which are connected to the respective gates of switches 170*a*, 170*b*, 172 and 176. The switches are controlled by circuit 166 based upon i) the 2 non-set point input voltages from 160 and 168; ii) logic which provides control appropriate for a particular application; and (iii) an input from current sensor 175 which generates a signal representative of the current in inductor 178. FIG. 7, described in detail below, illustrates a preferred embodiment of such control useable for purposes of providing DC power in a data center.

Controllers 216 and 218 include 1 output each, 6 and 9, respectively, which are connected to the respective gates of switches 184 and 196. Switch 184 is controlled by controller 216 based upon i) the 2 non-set point input voltages from 198 and 212; ii) the power rating input (see FIG. 8, 268); iii) a signal representative of a current limit threshold (see, e.g. FIG. 8, 269); and iv) logic which provides control appropriate for a particular application. FIG. 8, described in detail below, illustrates a preferred embodiment of such control useable for purposes of providing DC power in a data center. Switch 196 is controlled by controller 218 based upon i) the 2 non-set point input voltages from 200 and 214; ii) the power rating input (see FIG. 9, 288); iii) a signal representative of a current limit threshold (see, e.g. FIG. 9, 289); and iv) logic which provides control appropriate for a particular application. FIG. 9, described in detail below, illustrates a preferred embodiment of such control useable for purposes of providing DC power in a data center.

In operation, circuit 166, controller 216 and controller 218 control the gates of the respective switches based upon the respective inputs and set points to i) maintain the voltage differential between neutral 20*c* and ground 32 constant (as defined above) at 0 volts, and ii) maintain the voltage differential between positive voltage 20*a* and neutral 20*b*, and negative voltage 20*c* and neutral 20*b* at a constant (as defined above) system voltage differential (e.g. +190 volts and −190 volts).

Referring again to FIGS. 5, 5A and 6, these figures show the circuitry of embodiments of DC to DC converters with neutral point balancing. By using high frequency control of the central semiconductor device units, FIGS. 5 and 5A, elements 100*a*, 100*b*, 102, and 106, and FIG. 6, components 170*a*, 170*b*, 172, and 176, the input bus is balanced which maintains two independent voltage rails relative to neutral, and neutral point regulator maintains the neutral point to 0V relative to ground.

The neutral balancing circuitry allows for constant voltage to ground of the system. This voltage is maintained both under normal operating conditions and under fault conditions. By maintaining the neutral voltage, the system is allowed to respond in a similar way to an alternating current system when a fault occurs. This permits a protective device to clear and the system to return to normal operation after the fault has occurred.

Figure 10:
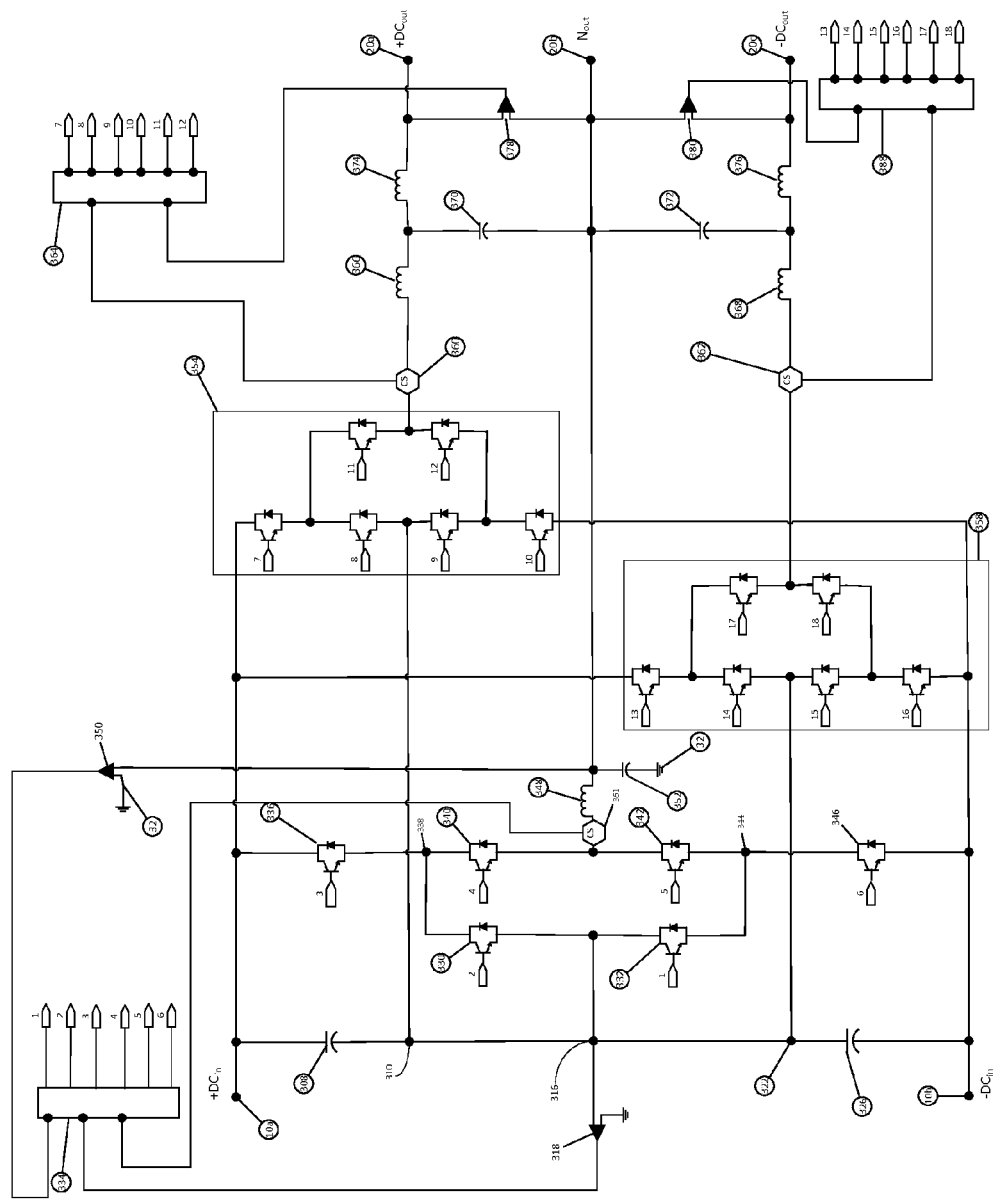
FIG. 10 illustrates a fourth embodiment of a DC to DC converter which has a neutral controlled relative to Earth Ground and DC voltages controlled relative to the neutral.

In the preferred embodiments described in FIGS. 5, 5A, 6, and 10, the switches are insulated gate bipolar transistors. Alternative switching components, e.g., alternate semiconductor switches, field effect transistors, etc., can be used for components 100a, 100b, 102, 106, 116, 120, 124, and 126 in FIGS. 5 and 5A, and components 170a, 170b, 172, 176, 184, and 196 in FIG. 6. In addition, the stacking of H-bridge converters can be further stacked to allow for higher voltage neutral point variants of the circuitry shown. FIG. 10 is an example which allows for higher voltage differential input voltages and yet allows for lower voltage power electronic semiconductors to be used, and the neutral point regulator to allow for a prescribed output DC voltage with the same behavior as the similar stacked configurations.

FIG. 7 illustrates an embodiment of switch control logic 98 and 166. The control logic illustrated in FIG. 7 includes:
Voltage loop controller logic 230,
Current loop controller logic 232,
Switching frequency controller logic 234,
Output switch controller node 256,
Output switch controller node 258,
Output switch controller node 260, and
Output switch controller node 264.

The component and circuit symbols used in FIG. 7 are industry standard symbols. As depicted, the controller has an inner current loop 232, an outer voltage loop 230, which work together to maintain a zero volt reference at point 110 of FIGS. 5 and 5A, and at point 180 of FIG. 6, and equivalents in other topologies such as the embodiment shown in FIG. 10.

FIG. 8 illustrates an embodiment of a positive leg controller 146 or 216. The positive leg controller of FIG. 8 includes:
Positive leg current sensor feedback 266, coupled to 128 or 198,
Kilowatt rated power output for discrete unit 268,
Positive voltage feedback signal 270, coupled to 142 or 212,
Voltage droop controller logic 274,
Outer voltage loop controller logic 276,
Inner current loop controller logic 278,
Switching frequency controller logic 280,
Positive output switch primary control signal for gating 6, and
Positive output switch NOT control signal for gating 7.

The component and circuit symbols used in FIG. 8 are industry standard symbols.

FIG. 9 illustrates an embodiment of a negative leg controller 148 or 218. The negative leg controller of FIG. 9 includes:
Negative leg current sensor feedback 286 coupled to 130 or 200,
Kilowatt rated power output for discrete unit 288,
Negative voltage feedback signal 290 coupled to 144 or 214,
Voltage droop controller logic 294,
Outer voltage loop controller logic 296,
Inner current loop controller logic 298,
Switching frequency controller logic 300,
Negative leg output switch primary control signal for gating 9, and
Negative leg output switch NOT control signal for gating 8.

The component and circuit symbols used in FIG. 9 are industry standard symbols.

FIG. 10 illustrates a fourth embodiment of DC to DC converter/stage 14 which has neutral 20b controlled relative to ground 32 with DC voltages 20a and 20c controlled relative to neutral 20b. The converter of FIG. 10 includes:
Positive DC input terminal 10a,
Upper capacitive energy storage element 308,
Upper center point node 310,
Center point node 316,
Center point voltage sensor 318,
Lower center point node 322,
Lower capacitive energy storage element 326,
Negative DC input terminal 10b,
Neutral leg switching device for neutral voltage controller circuit (2) 330,
Neutral leg switching device for neutral voltage controller circuit (1) 332,
3 Level neutral, voltage controller (i.e. neutral voltage controller) 334,
Upper switching device for neutral voltage controller circuit (3) 336,
Upper connection node connection 338,
Neutral leg switching device for neutral voltage controller circuit (4) 340,
Neutral leg switching device for neutral voltage controller circuit (5) 342,
Lower connection node connection 344,
Lower switching device for neutral voltage controller circuit (6) 346,
Inductive element for neutral point voltage controller 348,
Neutral point voltage to ground sensor connection 350,
Neutral regulator current sensor 351,
Capacitive energy storage element to ground for neutral point regulator circuit 352,
Earth ground 32,
Upper 3 level diode clamped switch array (7, 8, 9, 10, 11, 12) 354,
Central node 356,
Lower 3 level diode clamped switch array (13, 14, 15, 16, 17, 18) 358
Upper leg output control current sensor 360,
Lower leg output control current sensor 362,
Output positive phase voltage controller, drooping, outer voltage, inner current, 3 level controller 364,
Upper leg output inductive element 366,
Lower leg output inductive element 368,
Upper leg capacitive energy storage element 370,
Lower leg capacitive energy storage element 372,
Upper leg output secondary inductive element 374,
Lower leg output secondary inductive element 376,
Output positive rail voltage to neutral point sensor 378,
Output negative rail voltage to neutral point sensor 380,
Positive DC output terminal 20a,
Neutral terminal 20b,
Negative DC output terminal 20c, and
Output positive phase voltage controller, drooping, outer voltage, inner current, 3 level controller 388.

The component and circuit symbols used in FIG. 10 are industry standard symbols.

Circuit 334 (which would be configured to operate in accordance with the circuit in FIG. 7 to control 2 additional switches), controller 364 (which would be configured to operate in accordance with the circuit in FIG. 8 to control 4 additional switches) and controller 388 (which would be configured to operate in accordance with the circuit in FIG. 9 to control 4 additional switches) operate to control the voltage differential between neutral 20b and ground 32 in conjunction with maintaining the voltage differential between the output DC voltages between 20a and 20b and 20b and 20c, respectively. There are 3 non-set point inputs to circuit 334. The first is the output of a voltage sensor 318 which operates as a center point sensor. In particular, voltage sensor 318 generates a signal representative of the voltage differential between ground 32 and the center point voltage 316 between the positive DC voltage 10a and the negative DC voltage 10b and applies this signal to circuit 334. The second input is the output of a voltage sensor 350. In particular, voltage sensor 350 generates a signal representative of the voltage differential between ground 32 and the neutral voltage 20b between the positive DC voltage 20a and the negative DC voltage 20c and applies this signal to circuit 334. The third input is the output of a current sensor 351. In particular, current sensor 351 generates a signal representative of the current through inductor 348 and applies this signal to circuit 334.

Various modifications and configurations of DC to DC power transfer implemented by a reduction in voltage and increase in available current and voltage control have been described in detail above. However, as improvements and changes are made in the availability of semiconductors which can replace those herein, it is anticipated that those changes would fall within the scope of the claims set out below. One of the primary objectives of the circuitry is to transfer power with the DC to DC converter as efficiently as possible. Accordingly, it is contemplated that components and circuitry in the converter would be replaced with improved and/or more efficient substitutes.

In operation, the circuitry set out herein is configured to provide a multilevel power electronic half bridge which cancels or reduces disturbances on a neutral point of the bipolar output stage (e.g. at neutral 20b). Such a circuit is effective for many applications without complete cancellation as long as the amplitude and frequency of the disturbances are below those tolerable by the system utilizing the DC power generated by the circuit. Cancellation is possible for harmonics up to roughly one tenth of the switching frequency (e.g. 4-12 KHz and preferably 8 KHz) for the circuits of FIGS. 5, 5A, 6 and 10). In operation, higher frequency harmonics are then shunted to ground via a capacitor (i.e. capacitor 114 in FIGS. 5 and 5A, capacitor 182 in FIG. 6, and capacitor 352 in FIG. 10) connected between the neutral 20a and ground 32. The result of this combination is that low frequency disturbances (e.g. less than 1/10 of the switching frequency) are handled by the power electronic stage and higher frequencies (e.g. greater than 1/10 the switching frequency) are managed with the capacitor connection resulting in a near zero voltage differential between neutral 20a and ground 32.

As disclosed above and shown in FIGS. 5, 5A, 6, and 10, controllers 146 and 148 (FIG. 5/5A embodiment), controllers 216 and 218 (FIG. 6 embodiment) and controllers 364 and 388 (FIG. 10 embodiment) control the bipolar output stage between DC voltage 20a and neutral 20b and the bipolar output stage between neutral 20b and DC voltage 20c. These stages, which use variations of electronic half bridges which are independently switched by the respective controllers, improve the control and relationship of the differential voltages between 20a and 20b, and 20b and 20c. This independent control provides for robust disturbance rejection during unbalanced loading of the electrical system. More specifically, this arrangement permits the DC voltages at 20a and 20c to be independently balanced around neutral 20b within a frequency range which does not adversely affect the power supplied to the electrical loads (e.g. servers and computers) or the ability of the system to accomplish circuit protection.

It should be understood that the figures illustrate the exemplary embodiments in detail, and it should be understood that the present application is not limited to the details or methodology set forth in the description or illustrated in the figures. It should also be understood that the terminology is for the purpose of description only and should not be regarded as limiting.

The details of the circuits shown in FIGS. 5, 5A, 6, and 10 are not dependent on size of the system. This topology can be utilized for very small power level systems as well as large power systems by paralleling and interleaving the units together on their outputs. So without respect to size, this topology can be utilized from low voltage in to medium voltage direct current voltages all depending on the semiconductor devices and configuration of the converter topologies chosen for the application. The neutral point regulator allows for the application of the any typical bi-polar topology to be utilized and yet still retain the characteristics of the not exceeding a prescribed DC voltage to ground on the output side of the converter.

Further modifications and alternative embodiments of various aspects of the invention will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A direct current (DC) voltage to DC voltage converter comprising:
   a positive DC input terminal;
   a negative DC input terminal;
   a center point terminal coupled to the positive DC input terminal by at least a first capacitance and coupled to the negative DC input terminal by at least a second capacitance;
   a positive DC output terminal;
   a negative DC output terminal;
   a neutral terminal coupled to the positive DC output terminal by a first inductor and coupled to the negative DC output terminal by a second inductor;
   an output ground terminal connectable to a ground of a building;
   a positive DC output voltage controller coupled to the positive DC input terminal, the positive DC output terminal, and the neutral terminal, to control the voltage of the positive DC output terminal relative to the neutral terminal based upon the current flow between the input and positive DC output terminals and the voltage between the positive DC output terminal and the neutral terminal;

a negative DC output voltage controller coupled to the negative DC input terminal, the negative DC output terminal, and the neutral terminal, to control the voltage of the negative DC output terminal relative to the neutral terminal based upon the current flow between the input and negative DC output terminals and the voltage between the negative DC output terminal and the neutral terminal; and a neutral terminal voltage controller coupled to the center point terminal, the neutral terminal and output ground terminal to minimize the difference in voltage potential between the neutral terminal voltage and the potential of the output ground terminal when the output ground terminal is connected to the ground of a building.

2. The converter of claim 1, further comprising a first capacitance coupled between the neutral terminal and the positive DC output terminal.

3. The converter of claim 2, further comprising a second capacitance coupled between the neutral terminal and the negative DC output terminal.

4. The converter of claim 1, further comprising a third inductor coupled between the neutral terminal and the positive DC output terminal.

5. The converter of claim 4, further comprising a fourth inductor coupled between the neutral terminal and the negative DC output terminal.

6. The converter of claim 1, wherein the neutral terminal voltage controller is coupled to the output of a voltage sensor coupled between the center point terminal and the output ground terminal.

7. The converter of claim 1, further comprising:
a first voltage sensor having an input coupled to the center point terminal, an input coupled to the output ground terminal, and an output coupled to the neutral voltage controller; and
a second voltage sensor having an input coupled to the center point terminal by an inductor and 2 switches each having a control input, an input coupled to the output ground terminal, and an output coupled to the neutral voltage controller, the neutral voltage controller minimizing the voltage differential between the neutral terminal and the output ground terminal by at least applying signals to the control inputs of the 2 switches based upon the outputs of the first and second voltage sensors.

8. The converter of claim 7, further comprising:
a third voltage sensor having an input coupled to the neutral terminal, an input coupled to the positive DC output terminal, and an output coupled to the positive DC output voltage controller; and
a first current sensor coupled to a conductor coupled between the neutral terminal and positive DC output terminal by a first switch having a first control input coupled to the positive DC output voltage controller, wherein the conductor is also coupled to the positive DC input terminal by a second switch having a second control input coupled to the positive DC output voltage controller, the first current sensor generating a first signal representative of the current flow in the conductor, the first signal being applied to the positive DC output voltage controller, the positive DC output voltage controller being operable to control the switching of the first and second switches to control the voltage differential between the positive DC output terminal and the neutral terminal based upon at least the output of the third voltage sensor and the first signal representative of current flow.

9. The converter of claim 8, further comprising:
a fourth voltage sensor having an input coupled to the neutral terminal, an input coupled to the negative DC output terminal, and an output coupled to the negative DC output voltage controller; and
a second current sensor coupled to a conductor coupled between the neutral terminal and negative DC output terminal by a third switch having a third control input coupled to the negative DC output voltage controller, wherein the conductor is also coupled to the negative DC input terminal by a fourth switch having a fourth control input coupled to the negative DC output voltage controller, the second current sensor generating a second signal representative of the current flow in the conductor, the signal being applied to the negative DC output voltage controller, the negative DC output voltage controller being operable to control the switching of the third and fourth switches to control the voltage differential between the negative DC output terminal and the neutral terminal based upon at least the output of the fourth voltage sensor and the second signal representative of current flow.

10. An electrical power conversion circuit which generates output DC power at separate terminals referenced to a neutral terminal, the circuit comprising:
a first terminal to which a DC current is to be applied at a first voltage;
a second terminal to which a DC current is to be applied at a second voltage different from the first voltage by an input voltage differential;
a neutral terminal coupled to the first terminal by a first inductor and coupled to the second terminal by the first inductor;
a positive DC terminal coupled to the first terminal by at least a second inductor and a first switch having a first control input, and coupled to the neutral terminal by the second inductor and a second switch having a second control input;
a negative DC terminal coupled to the second terminal by at least a third inductor and a third switch having a third control input, and coupled to the neutral terminal by the third inductor and a fourth switch having a fourth control input;
a positive DC voltage controller to which a first signal representative of a first voltage differential between the positive DC terminal and the neutral terminal, and a second signal representative of a current flow between the positive DC terminal and the first terminal are applied, the positive DC voltage controller including first and second control outputs coupled to the first and second control inputs, respectively, to control the differential voltage between the positive DC terminal and the neutral terminal within a predetermined range; and
a negative DC voltage controller to which a third signal representative of a second voltage differential between the negative DC terminal and the neutral terminal, and a fourth signal representative of a current flow between the negative DC terminal and the second terminal are applied, the negative DC voltage controller including third and fourth control outputs coupled to the third and fourth control inputs, respectively, to control the differential voltage between the negative DC terminal and the neutral terminal within a predetermined range, wherein the input voltage range is greater than the sum of the first and second voltage differentials, wherein the controllers control the first voltage differential independently of the second voltage differential.

11. The circuit of claim 10, further comprising:
a center point terminal coupled to the first terminal with a first capacitor and a second terminal with the second capacitor;
an Earth Ground terminal connectable to the ground of a building; and
a neutral terminal voltage controller coupled to the center point terminal, the neutral terminal and Earth Ground to minimize the voltage differential between the neutral terminal and the Earth Ground terminal.

12. The circuit of claim 11, further comprising:
a first voltage sensor having an input coupled to the center point terminal, an input coupled to Earth Ground, and an output coupled to the neutral terminal voltage controller; and
a second voltage sensor having an input coupled to the center point terminal by the first inductor and 2 switches each having a respective control input, an input coupled to Earth Ground, and an output coupled to the neutral voltage controller, the neutral voltage controller minimizing the voltage differential between the neutral terminal and Earth Ground by at least applying signals to the control inputs of the 2 switches based upon the outputs of the first and second voltage sensors.

13. The circuit of claim 12, further comprising:
a third voltage sensor having an input coupled to the neutral terminal and an input coupled to the positive DC terminal to generate the first signal at an output coupled to the positive DC voltage controller; and
a first current sensor coupled to a first conductor coupled between the neutral terminal and positive DC terminal by a first switch having a first control input coupled to the positive DC voltage controller, wherein the first conductor is also coupled to the first input terminal by a second switch having a second control input coupled to the positive DC voltage controller, the first current sensor generating the second signal, the positive DC voltage controller being operable to control the switching of the first and second switches to control the differential voltage between the positive DC terminal and the neutral terminal within a predetermined range.

14. The circuit of claim 13, further comprising:
a fourth voltage sensor having an input coupled to the neutral terminal and an input coupled to the negative DC terminal to generate the third signal at an output coupled to the negative DC voltage controller; and
a second current sensor coupled to a second conductor coupled between the neutral terminal and negative DC terminal by a third switch having a third control input coupled to the negative DC voltage controller, wherein the second conductor is also coupled to the second input terminal by a fourth switch having a fourth control input coupled to the negative DC voltage controller, the second current sensor generating the fourth signal, the negative DC voltage controller being operable to control the switching of the third and fourth switches to control the differential voltage between the negative DC terminal and the neutral terminal within a predetermined range.

15. The circuit of claim 14, further comprising:
a fifth inductor coupled in series between the third inductor and the fourth switch; and
a fourth capacitor coupled in parallel with the third inductor between the neutral terminal and the negative DC terminal.

16. The circuit of claim 13, further comprising:
a fourth inductor coupled in series between the second inductor and the second switch; and
a third capacitor coupled in parallel with the second inductor between the neutral terminal and the positive DC terminal.

17. The circuit of claim 13, wherein the differential voltages between the neutral terminal and the positive and negative DC terminals have a variable amplitude component controlled upon switching frequency.

18. An electrical power conversion circuit which generates output DC power at separate terminals referenced to a neutral terminal wherein the voltage differential between the neutral terminal and Earth Ground is controlled, the circuit comprising:
a positive DC input terminal;
a negative DC input terminal;
a center point terminal;
means for coupling the positive DC input terminal to the center point terminal;
means for coupling the negative DC input terminal to the center point terminal;
a positive DC output terminal;
a negative DC output terminal;
a neutral terminal;
an Earth Ground terminal connectable to the ground of a building;
means for coupling the neutral terminal to the center point terminal;
means for coupling the positive DC output terminal to the positive DC input terminal and the neutral terminal;
means for coupling the negative DC output terminal to the negative DC input terminal and the neutral terminal;
means for controlling a positive voltage differential between the positive DC output terminal and the neutral terminal based upon a signal representative of the current flow between the positive DC input and output terminals and a signal representative of the positive voltage differential;
means for controlling a negative voltage differential between the negative DC output terminal and the neutral terminal based upon a signal representative of the current flow between the negative DC input and output terminals and a signal representative of the negative voltage differential; and
means for controlling a neutral voltage differential between the neutral terminal and the Earth Ground terminal based upon a signal representative of the voltage differential between the center point terminal and the Earth Ground terminal and a signal representative of the voltage differential between the neutral terminal and Earth Ground terminal.

19. The circuit of claim 18, wherein the means for coupling the positive DC input terminal to the center point terminal includes a first capacitance and the means for coupling the negative DC input terminal to the center point terminal includes a second capacitance of substantially equal value to the first capacitance.

20. The circuit of claim 19, wherein the means for coupling the neutral terminal to the center point terminal includes first and second controlled switches and an inductance coupled in series between the neutral terminal and the center point terminal; the means for coupling the positive DC output terminal to the positive DC input terminal and the neutral terminal comprises at least 2 inductances; and the means for coupling the negative DC output terminal to the negative DC input terminal and the neutral terminal comprises at least 2 inductances.

21. The circuit of claim 20, wherein the means for controlling a positive voltage differential between the positive DC output terminal and the neutral terminal includes a current sensor which generates the signal representative of current flow, a voltage sensor which generates the signal representative of the positive voltage differential, third and fourth controlled switches coupled between the neutral terminal and the positive DC input terminal in parallel with the first and second controlled switches, and a positive voltage controller which controls the third and fourth switches based upon the signals.

22. The circuit of claim 20, wherein the means for controlling a negative voltage differential between the negative DC output terminal and the neutral terminal includes a current sensor which generates the signal representative of current flow, a voltage sensor which generates the signal representative of the negative voltage differential, fifth and sixth controlled switches coupled between the neutral terminal and the negative DC input terminal in parallel with the first and second controlled switches, and a negative voltage controller which controls the fifth and sixth switches based upon the signals.

23. The circuit of claim 20, wherein the means for controlling a neutral voltage differential between the neutral terminal and the Earth Ground terminal includes a voltage sensor which generates the signal representative of the voltage differential between the center point terminal and the Earth Ground terminal, a voltage sensor which generates the signal representative of the voltage differential between the neutral terminal and the Earth Ground terminal, and a neutral controller coupled to the first and second switches and to control the neutral voltage differential between the neutral terminal and the Earth Ground terminal based upon a signal representative of the voltage differential between the center point terminal and the Earth Ground terminal and a signal representative of the voltage differential between the neutral terminal and Earth Ground terminal.

\* \* \* \* \*